(12) United States Patent
Park

(10) Patent No.: US 7,291,972 B2
(45) Date of Patent: Nov. 6, 2007

(54) DUAL PANEL TYPE ORGANIC ELECTROLUMINESCENT DISPLAY DEVICE AND METHOD OF FABRICATING THE SAME

(75) Inventor: Jae-Yong Park, Gyeonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 196 days.

(21) Appl. No.: 11/020,198

(22) Filed: Dec. 27, 2004

(65) Prior Publication Data

US 2005/0162077 A1    Jul. 28, 2005

(30) Foreign Application Priority Data

Dec. 26, 2003    (KR)    ............ 10-2003-0097875

(51) Int. Cl.
*H05B 33/00*    (2006.01)
(52) U.S. Cl. ..................... 313/504; 313/512
(58) Field of Classification Search ........ 313/504–506, 313/512
See application file for complete search history.

(56) References Cited

U.S. PATENT DOCUMENTS 6,104,137 A * 8/2000 Abiko et al. ............... 313/506

6,861,802 B2 * 3/2005 Hishida ..................... 313/512

FOREIGN PATENT DOCUMENTS

| JP | 09-134781 | 5/1997 |
| JP | 14-158088 | 5/2002 |
| KR | 2003-84233 | 11/2003 |

* cited by examiner

*Primary Examiner*—Joseph Williams
(74) *Attorney, Agent, or Firm*—Morgan, Lewis & Bockius LLP

(57) ABSTRACT

An organic electroluminescent device includes first and second substrates spaced apart from each other, the first and second substrates including a first region and a second region, the second region outside the first region and including a concave portion, an array element on an inner surface of the first substrate, the array element including a switching element, an organic electroluminescent diode on an inner surface of the second substrate, a connection electrode electrically connecting the array element and the organic electroluminescent diode, the connection electrode between the first and second substrates, and a bar-type desiccant in the concave portion of the second region between the first and second substrates.

24 Claims, 10 Drawing Sheets emission direction

DUAL PANEL TYPE ORGANIC ELECTROLUMINESCENT DISPLAY DEVICE AND METHOD OF FABRICATING THE SAME

The present application claims the benefit of Korean Patent Application No. 2003-97875 filed in Korea on Dec. 26, 2003, which is hereby incorporated by reference.

BACKGROUND OF THE INVENTION

1. Field of the Invention

The present invention relates to a display device, and more particularly, to a dual panel type organic electroluminescent (EL) display device and a method of fabricating the same.

2. Discussion of the Related Art

Among flat panel displays (FPDs), organic electroluminescent (EL) display devices have been of particular interest in research and development because they are light-emitting type displays having superior brightness, wide viewing angle and high contrast ratio. In particular, an organic EL display device is a self-luminous device and does not need an additional light source to emit light. Accordingly, an organic EL display device has a very thin profile and light weight.

In addition, the organic EL display device can be operated using a low direct-current (DC) voltage, thereby having low power consumption and fast response time. Further, the organic EL display device is an integrated device, such that it has high endurance of external impacts, a large operational temperature range and a wide range of applications. Moreover, the organic EL display device generally is manufactured using a relatively simple process including a deposition process and an encapsulation process. Thus, an organic EL display device has a low production cost.

An active matrix type organic EL display device includes thin film transistors as switching elements within each pixel. The voltage applied to the pixels are charged in a storage capacitor Cst so that the voltage can be applied until the next frame signal is applied, thereby continuously driving the organic EL display device, regardless of the number of gate lines, until a picture of images is finished. Accordingly, the active matrix type organic EL display device provides uniform luminescence, even when a low current is applied and the display area is large.

FIG. 1 is a schematic cross-sectional view of an organic EL display device according to the related art. In FIG. 1, an organic EL display device includes first and second substrates 10 and 60 facing each other and spaced apart from each other. An array element layer AL is formed on the first substrate 10 and includes a thin film transistor (TFT) T. Although not shown, the array element layer AL further includes a gate line, a data line crossing the gate line to define a pixel region P, and a power line crossing one of the gate and data lines. In addition, a first electrode 48, an organic electroluminescent (EL) layer 54 and a second electrode 56, which constitute an organic EL diode $D_{EL}$, are sequentially formed on the array element layer AL. The first electrode 48 is connected to the TFT T.

In addition, the second substrate 60 functions as an encapsulating panel having a receded portion 62. A desiccant 64 is packaged in the receded portion 62 to protect the organic EL display device from moisture. A seal pattern 70 is formed between the first and second substrates 10 and 60 in a periphery thereof. With the seal pattern 70, the first and second substrates 10 and 60 are attached to each other.

FIG. 2A is a schematic plan view of a pixel region of the organic EL display device shown in FIG. 1. As shown in FIG. 2A, a gate line 22 crosses a data line 42 and a power line 28, and the data line 42 and the power line 28 are spaced apart from each other. The pixel region P is defined by the gate line 22 and the data line 42. A switching TFT $T_S$ is located adjacent to the crossing of the gate line 22 and the data line 42. A driving TFT $T_d$ is connected to the switching TFT $T_S$ and the power line 28. A storage capacitor $C_{ST}$ uses a portion of the power line 28 as a first capacitor electrode and an active pattern 16 extending from an active layer 31 of the switching TFT $T_S$ as a second capacitor electrode. The first electrode 48 is connected to the driving TFT $T_d$. The switching TFT $T_S$ and the driving TFT $T_d$ constitute a TFT T. Although not shown, the organic EL layer 54 and the second electrode 56 (shown in FIG. 1) are sequentially formed on the first electrode 48.

FIG. 2B is a schematic cross-sectional view along II-II of FIG. 2A. As shown in FIG. 2B, the driving TFT $T_d$ including an active layer 14, a gate electrode 20, source electrode 38, and drain electrode 40 is formed on the first substrate 10. The source electrode 38 connects to the power line 28 through a power electrode 26 that is connected to the power line 28, and the drain electrode 40 connects to the first electrode 48. The active pattern 16 is formed with the same material as the active layer 14 and is formed under the power line 28 having conductivity. The active pattern 16 and the power line 28 constitute the storage capacitor $C_{ST}$. The organic EL layer 54 and the second electrode layer 56 are sequentially formed on the first electrode 48. The first electrode 48, the organic EL layer 54, and the second electrode 56 constitute the organic EL diode $D_{EL}$.

In addition, a first insulating layer 12 is formed between the first substrate 10 and the active layer 14 as a buffer layer. A second insulating layer 18 is formed between the active layer 14 and the gate electrode 20 as a gate insulating layer. A third insulating layer 24 is formed between the active pattern 16 and the power line 28. A fourth insulating layer 30 is formed between the power line 28 and the source electrode 38. A fifth insulating layer 44 is formed between the drain electrode 40 and the first electrode 48. A sixth insulating layer 50 is formed between the first electrode 48 and the second electrode 56. The third to sixth insulating layers 24, 30, 44 and 50 include contact holes for electric connections of the respective electrodes.

In the organic EL display device according to the related art, the array element layer having TFTs and the organic electroluminescent (EL) diode are formed on the first substrate, and the second substrate is attached to the first substrate for encapsulation. However, when the array element layer having TFTs and the organic EL diode are formed on one substrate, production yield of the organic EL display device is determined by a multiplication of the array element layer's yield and the organic EL diode's yield. In particular, because the yield of the organic EL diode is relatively low, the production yield of the overall EL display device is limited by the yield of the organic EL diode. For example, even when TFTs are well fabricated, an organic EL display device using a thin film of about 1000 Å thickness can be determined to be defective due to a defect of an organic emission layer. This results in loss of materials and high production costs.

In addition, organic EL display devices are classified into bottom emission type devices and top emission type devices based on a direction of light emitted from the organic EL diodes. The bottom emission type organic EL display devices have advantages such as high encapsulation stability and high process flexibility. However, the bottom emission type organic EL display devices are ineffective for high resolution devices because they have a low aperture ratio.

In contrast, the top emission organic EL display devices have a higher expected life span because they are more easily designed and have a high aperture ratio. However, in the top emission type organic EL display devices, the cathode is generally formed on an organic emission layer. As a result, transmittance and optical efficiency of the top emission type organic EL display devices are reduced because of a limited number of materials that can be selected. Further, when a thin film passivation layer is formed to avoid the reduction of light transmittance, the thin film passivation layer may fail to block infiltration of exterior air into the device.

SUMMARY OF THE INVENTION

Accordingly, the present invention is directed to an organic electroluminescent display device and a method of fabricating the same that substantially obviate one or more of the problems due to limitations and disadvantages of the related art.

An object of the present invention is to provide an organic EL display device having an improved production yield, a high resolution and a high aperture ratio. An organic EL display device according to an embodiment of the present invention is a dual panel type such that an array element layer having TFT and an organic EL diode are formed on their respective substrates.

Another object of the present invention is to provide a dual panel type organic EL display device having a bar type desiccant and a method of fabricating the same that improve reliability, product life span, durability and product stability.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an organic electroluminescent device includes first and second substrates spaced apart from each other, the first and second substrates including a first region and a second region, the second region outside the first region and including a concave portion, an array element on an inner surface of the first substrate, the array element including a switching element, an organic electroluminescent diode on an inner surface of the second substrate, a connection electrode electrically connecting the array element and the organic electroluminescent diode, the connection electrode between the first and second substrates, and a bar-type desiccant in the concave portion of the second region between the first and second substrates.

In another aspect, a method of fabricating an organic electroluminescent device includes forming an array element including a switching element in a first region of a first substrate, forming an organic electroluminescent diode in a second region of a second substrate, the second region corresponding to the first region, forming a connection electrode on one of the first and second substrates, forming a concave portion in a third region of one of the first and second substrates, the third region being in a periphery of the first or second region, disposing a desiccant in the concave portion, and attaching the first and second substrate to each other such that the connection electrode electrically connecting the array element and the organic electroluminescent diode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments, examples of which are illustrated in the accompanying drawings.

Figure 3:
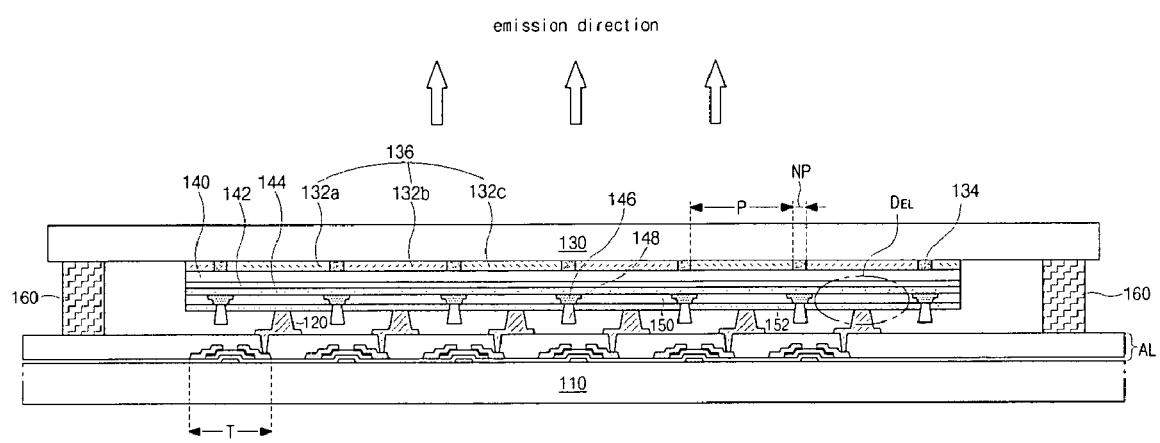
FIG. 3 is a schematic cross-sectional view of a dual panel type organic EL display device according to an embodiment of the present invention.

FIG. 3 is a schematic cross-sectional view of a dual panel type organic EL display device according to an embodiment of the present invention. In FIG. 3, an organic EL display device includes first and second substrates 110 and 130 attached to each other by a seal pattern 160 in a periphery region with a predetermined space therebetween. The EL display device also includes a plurality of pixel regions P and a non-pixel region NP. The pixel regions P may correspond to minimum regions for image display, and the non-pixel region NP may be the boundary of the pixel regions P.

In addition, the first substrate 110 includes an array element layer AL having a plurality of thin film transistors (TFTs) T, and a plurality of connection electrodes 120 formed on the array element AL. The connection electrode 120 connects to the TFT T and may be formed as a multi-layer including an organic insulating pattern having a predetermined height. Although not shown, the array element layer AL includes gate lines, data lines crossing the gate lines to define the pixel regions P, and power lines crossing one of the gate and data lines. Further, the TFT T may include switching TFT that controls a voltage from the gate and data lines, and driving TFT that controls a brightness using a voltage from a respective the switching TFT and the power line. For instance, the TFT T connected to the connection electrode 120 may be the driving TFT, and the TFT T may be amorphous-silicon TFT or poly-silicon TFT.

Further, the second substrate 130 includes a color filter layer 136, a black matrix 134, and an overcoat layer 140. The color filter layer 136 includes red, green and blue sub-color filters 132a, 132b, and 132c in the pixel regions P, and the black matrix 134 surrounds the color filter layer 136 in the non-pixel region NP. The overcoat layer 140 is formed on the entire surface of the second substrate 130 to planarize the entire surface of the color filter layer 136 and the black matrix 134. For instance, the overcoat layer 140 may be formed of insulating materials having a good planarization property, such as organic materials. In addition, a barrier layer 142 is formed on the overcoat layer 140 to prevent the organic EL display device from out gassing of the color filter layer 136.

The dual panel type organic EL display device may include a full-color element, such as a single type color filter layer or a double type color filter layer, to embody a full color. The single type color filter layer includes red, green and blue sub-color filters, and the double type color filter layer further includes color-changing mediums (CCM). Further, when the organic EL layer is formed as an independent emitting type, the full-color element may be omitted. In particular, the color filter layer 136, the black matrix 134, the overcoat layer 140 and the barrier layer 142 may constitute the full-color element. Alternatively, at least one of the black matrix 134, the overcoat layer 140, and the barrier layer 142 may be omitted.

Moreover, the second substrate 130 further includes a first electrode 144, an interlayer 146 and a separator 148. The first electrode 144 may be formed directly on the second substrate 130 both in the pixel regions P and the non-pixel region NP. In particular, the interlayer 146 and the separator 148 may be formed in the non-pixel region NP. The separator 148 may have a width that gradually increases from a portion near the second substrate 130 to a portion further away from the second substrate 130, such that the separator 148 has a trapezoid cross-sectional shape and has an inverted taper with respect to the second substrate 130. The separator 148 may divide the pixel regions P from one another.

In addition, the second substrate also includes an organic EL layer 150 and a second electrode 152 formed on the first electrode 144 in the pixel regions P. In particular, the interlayer 146 is formed to prevent the first electrode 144 and the second electrode 152 from shorting at a side portion of the separator 148. The organic EL layer 150 may include a single color emitting material such as a white color emitting material. Although not shown, when the organic EL display device is a double type full-color element, the organic EL layer 150 may include a single color emitting material, e.g., a blue color emitting material such as a sky blue color material or a greenish blue color material. Further, the second electrode 152 electrically connects to the connection electrode 120, such that the second electrode 152 and the TFT T are electrically connected to each other.

Moreover, the first electrode 144, the organic EL layer 150 and the second electrode 152 may constitute an organic EL diode $D_{EL}$. When the organic EL display device is a top emission type emitting light from the organic EL diode $D_{EL}$ toward the first electrode, the first electrode 144 is formed of a transparent conductive material. For example, when the first electrode 144 functions as an anode and the second electrode 152 functions as a cathode, the first electrode 144 may include one of indium-tin-oxide (ITO), indium-zinc-oxide (IZO) and indium-tin-zinc-oxide (ITZO).

Accordingly, the array element layer AL and the organic EL diode $D_{EL}$ are formed on different substrates, thereby increasing product yield and efficiency of the organic EL display device. In addition, the overall design of the array layer including TFTs is simplified. When the dual panel type organic EL display device is a top emission type, it further has such advantages as a high aperture ratio, a high resolution and a long expected life span. Moreover, because the organic EL layer and the second electrode are spaced by the separator without an additional mask, a production yield is higher.

However, since the array element layer AL and the organic EL diode $D_{EL}$ are formed on their respective substrates, a package type desiccant may not be formed in one of the substrates like the organic EL display device according to the related art. Thus, to eliminate internal moisture from the organic EL display device, the organic EL display device may have the configuration including a bar type desiccant in a concave portion as shown in FIGS. 4A and 4B.

Figure 4A:
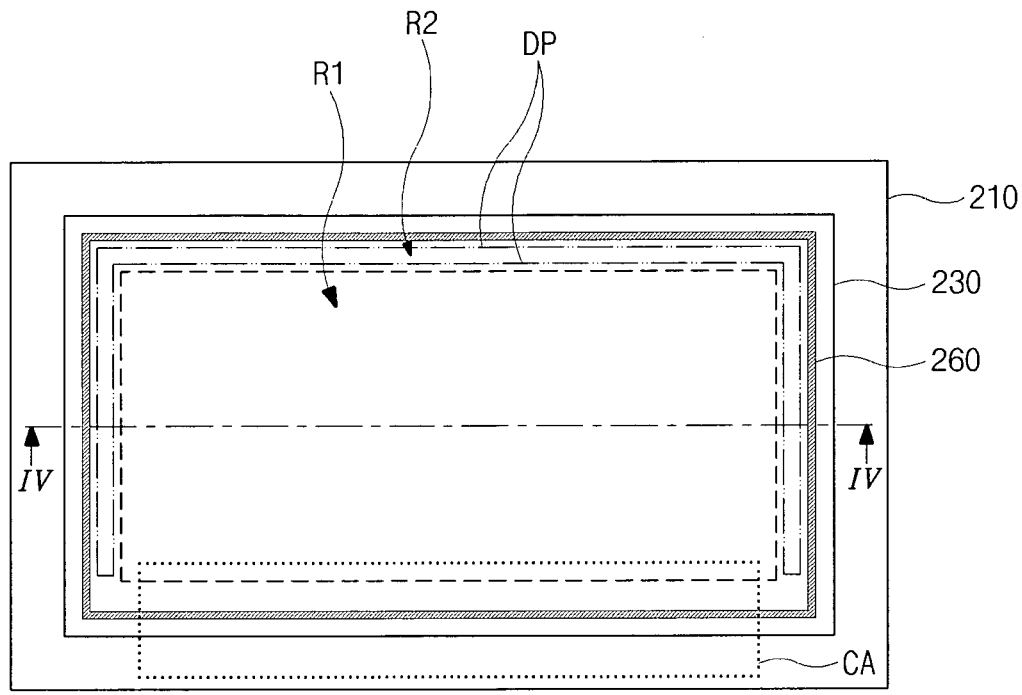
FIG. 4A is a schematic view of a dual panel type organic EL display device according to another embodiment of the present invention.

FIG. 4A is a schematic view of a dual panel type organic EL display device according to another embodiment of the present invention In FIG. 4A, an organic EL display device includes first and second substrates 210 and 230 attached to each other by a seal pattern 260 in a periphery region with a predetermined space therebetween. In particular, the EL display device includes a first region R1 and a second region R2. The first region R1 may be an emission region, and the second region R2 may be between the first region R1 and the seal pattern 260. The second region R2 may include an external circuit connecting portion CA along one edge of the organic EL display device and may include a desiccant packaging portion DP along other edges of the organic EL display device. For example, the desiccant packaging portion DP may be continuous along three edges of the organic EL display device.

Figure 4B:
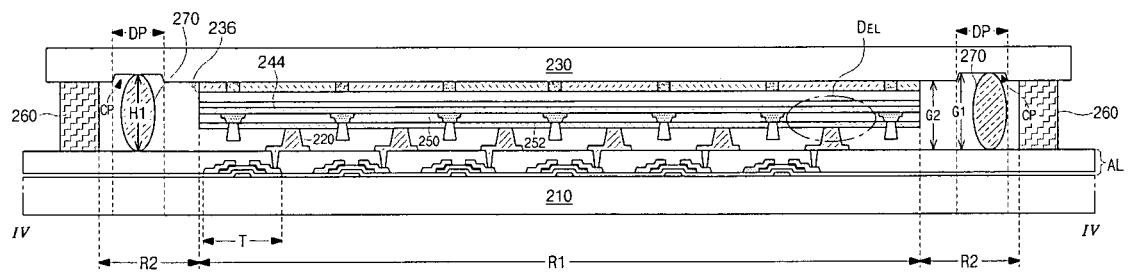
FIG. 4B is a schematic cross-sectional view along IV-IV of FIG. 4A.

FIG. 4B is a schematic cross-sectional view along IV-IV of FIG. 4A. As shown in FIG. 4B, an array element layer AL having a TFT T is formed on the first substrate 210. A connection electrode 220 is formed on the array element layer AL and is connected to the TFT T. In addition, a color filter layer 236 is formed on the second substrate 230. An organic EL diode $D_{EL}$ that includes a first electrode 244, an organic EL layer 250 and a second electrode 252 is formed over the color filter layer 236. In particular, the color filter layer 236 may function as a single type full-color element and the organic EL layer 250 may correspond to a single color type. Although not shown, the black matrix 134 (of FIG. 3), the overcoat layer 140 (of FIG. 3) and the barrier layer 142 (of FIG. 3) may be formed on the color filter layer 236 as the full-color element.

Further, a bar type desiccant 270 is located in the desiccant packaging portion DP, and the desiccant packaging portion DP includes a concave portion CP to fix the bar type desiccant 270. The bar type desiccant 270 may have a generally circular shape in its cross-section but the shape of the bar type desiccant 270 may be variously changed. The bar type desiccant 270 has a height H1 smaller or equal to a first gap G1 and larger than a second gap G2. The first gap G1 is the distance between the first and second substrates 210 and 230 in the concave portion CP and the second gap G2 is the distance between the first and second substrates 210 and 230 in the second region R2 except the desiccant packaging portion DP. The first gap G1 is bigger than the second gap G2. Therefore, due to the gap difference (G1−

G2) in the concave portion CP, the bar type desiccant 270 is at a stable position in the desiccant packaging portion DP.

Figure 1:
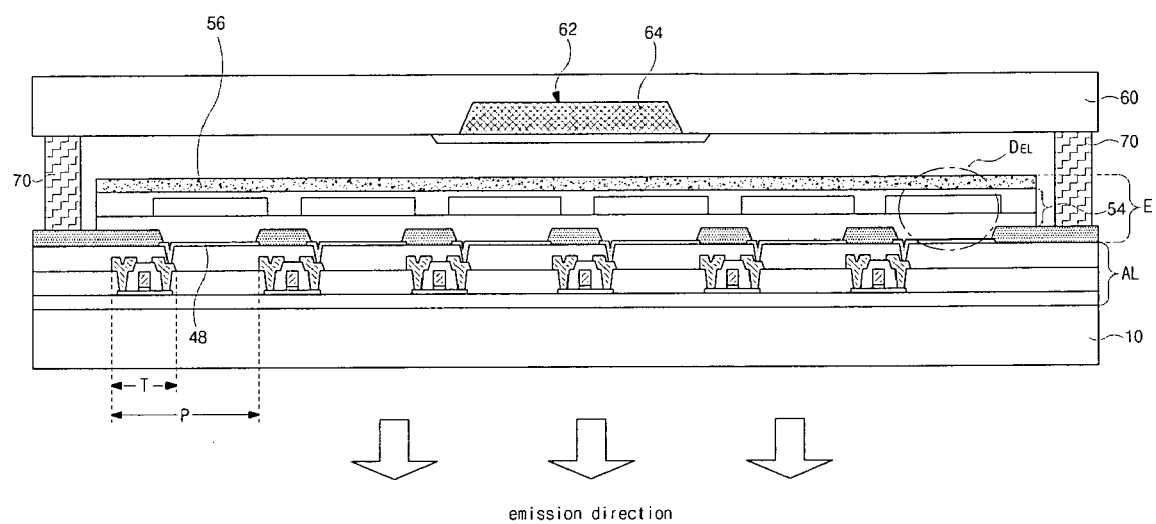
FIG. 1 is a schematic cross-sectional view of an organic EL display device according to the related art.
Figure 2A:
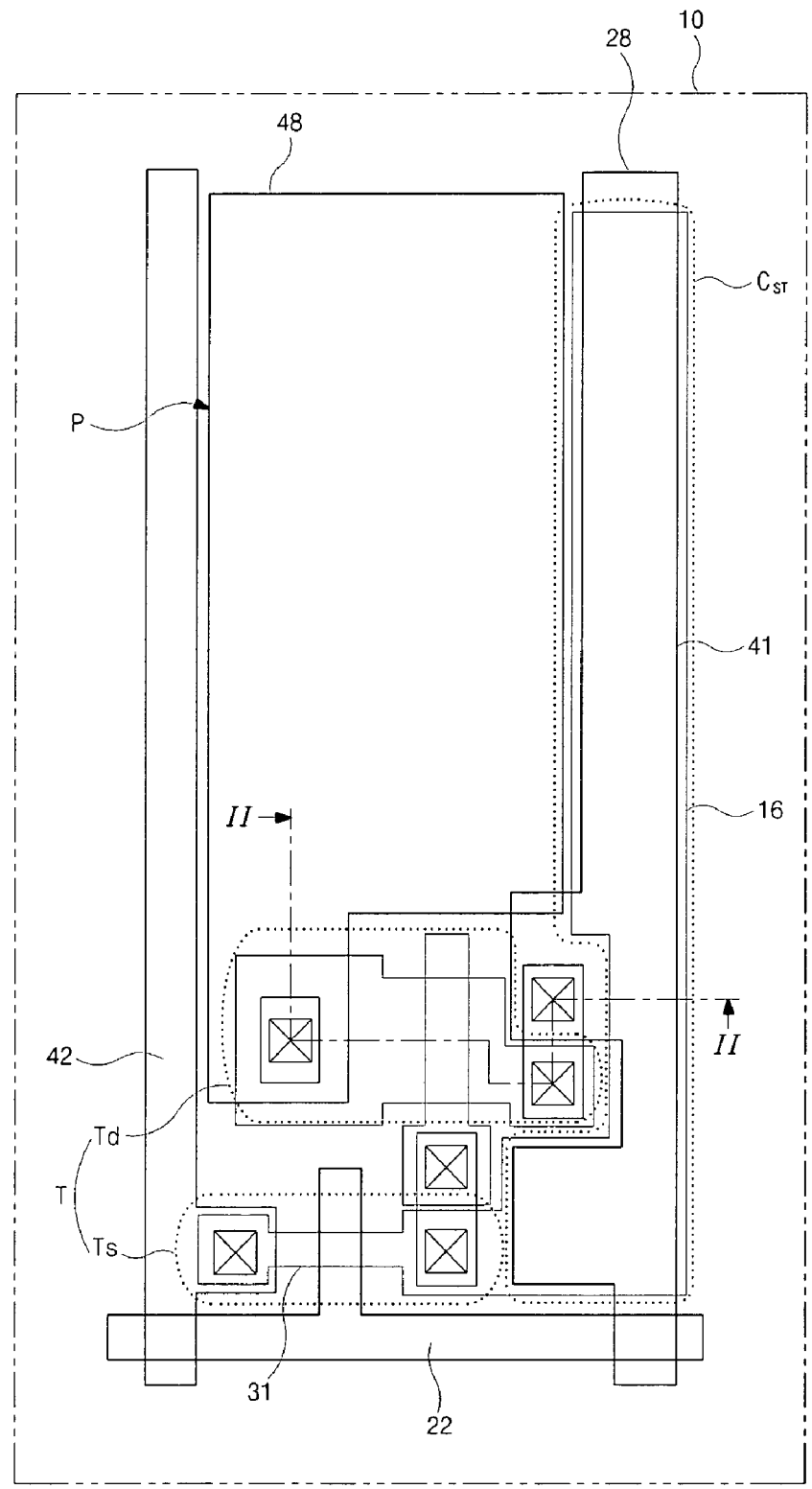
FIG. 2A is a schematic plan view of a pixel region of the organic EL display device shown in FIG. 1.
Figure 2B:
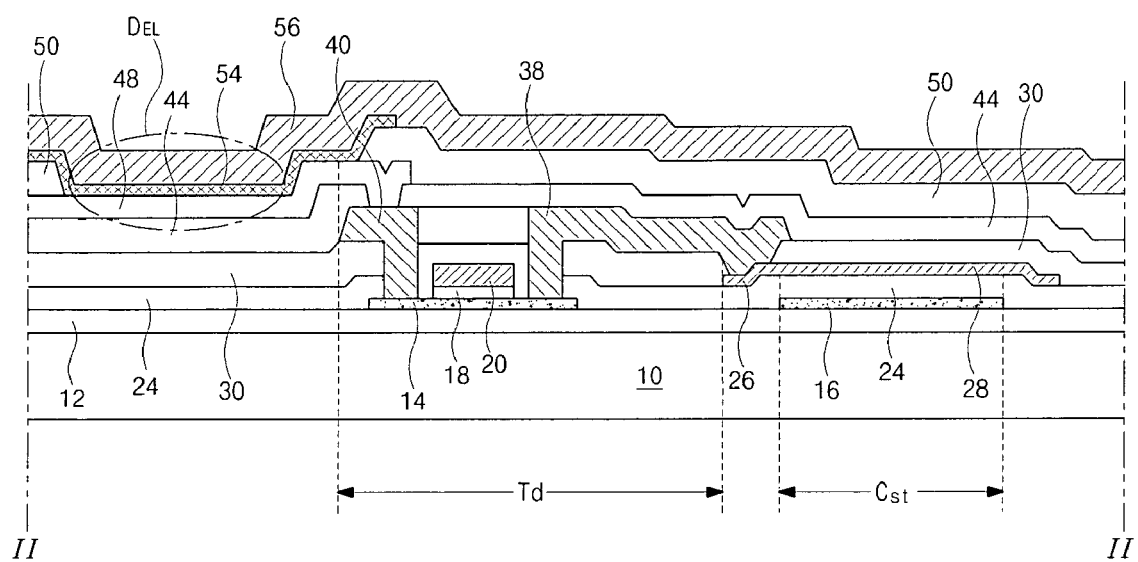
FIG. 2B is a schematic cross-sectional view along II-II of FIG. 2A.

In the organic EL display device according to the related art, the receded portion 62 (as shown in FIG. 1) may have a width of about more than 20 mm. However, a width of the desiccant packaging portion DP may only be about 5 mm, thereby maintaining the aperture ratio. Further, the concave portion CP may be formed by a wet-etching method using an etchant. However, due to isotropic etching, a precise depth of the concave portion CP may be difficult to control. Yet, since the desiccant 270 is of the bar type, the desiccant 270 still is stably fixed by the gap difference (G1–G2) in the concave portion CP.

Although not shown, the dual panel type organic EL display device according to an embodiment of the present invention may include a double type full-color element or an independent emitting type organic EL layer without the full-color element.

Figure 5:
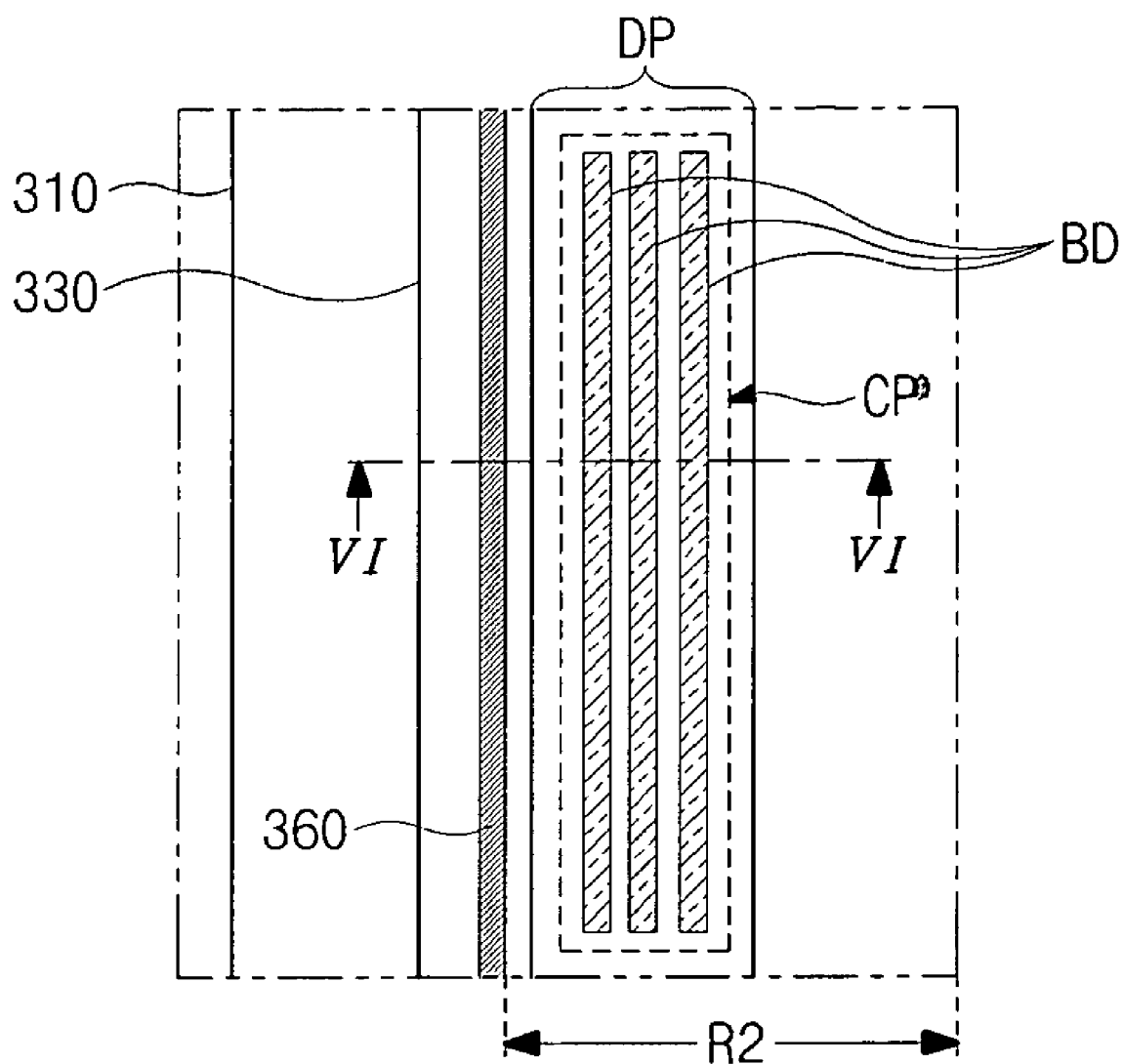
FIG. 5 is a schematic view of a periphery region of a dual panel type organic EL display device according to another embodiment of the present invention.

FIG. 5 is a schematic view of a periphery region of a dual panel type organic EL display device according to another embodiment of the present invention. In FIG. 5, an organic EL display device includes first and second substrates 310 and 330 attached to each other by a seal pattern 360 in a periphery region with a predetermined space therebetween. In particular, the EL display device includes a second region R2. Similar to the second region R2 shown in FIGS. 4A and 4B, the second region R2 may be between an emission region R1 and the seal pattern 360. The second region R2 may include a desiccant packaging portion DP. In particular, more than one bar type desiccants BD may be located in the desiccant packaging portion DP.

Figure 6A:
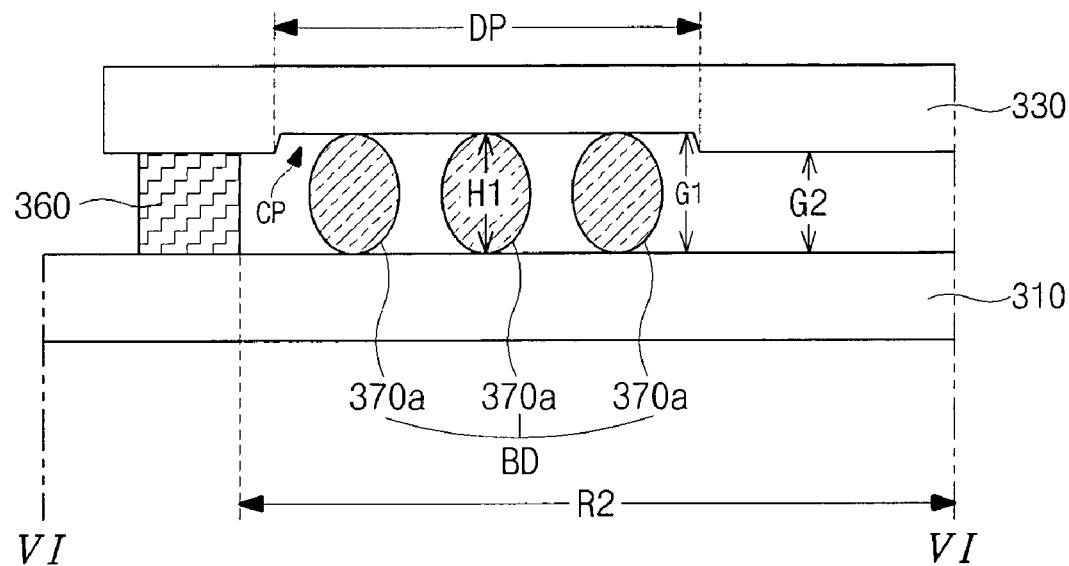
FIGS. 6A to 6C are cross-sectional views along VI-VI of FIG. 5.
Figure 6B:
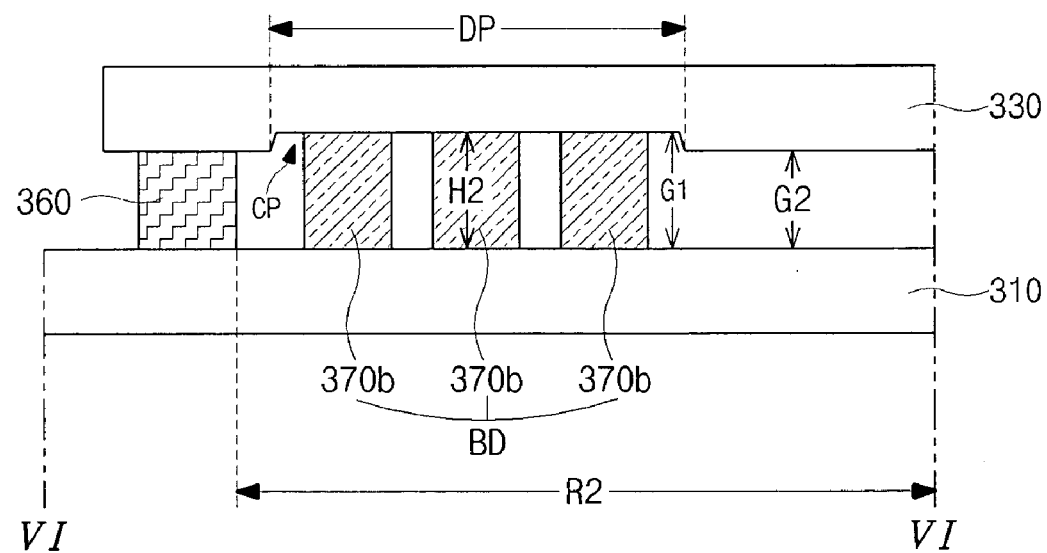
Figure 6C:
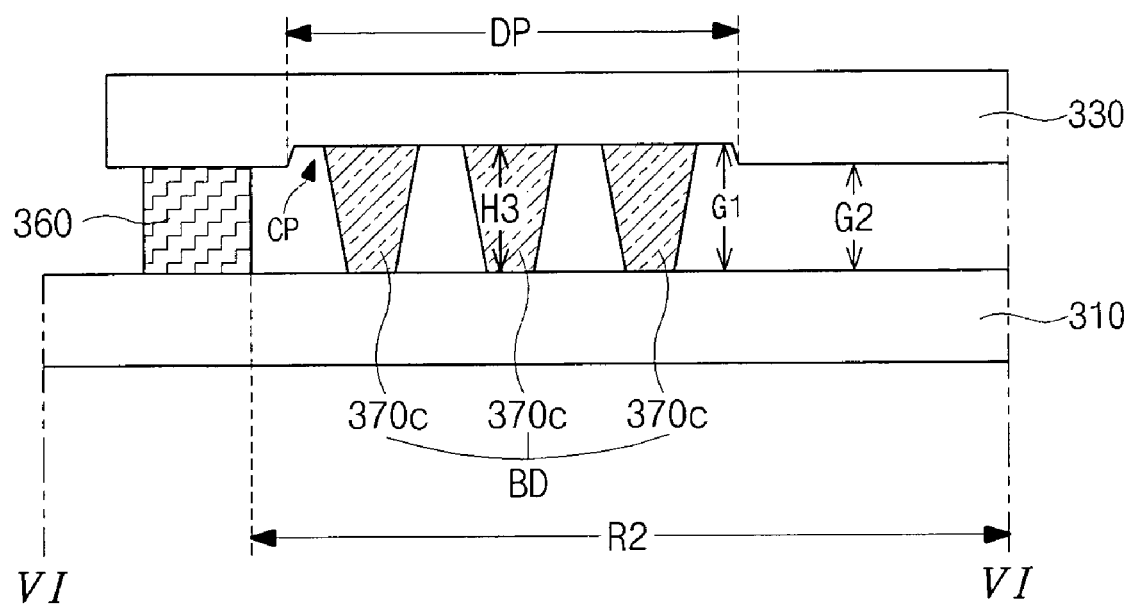

FIGS. 6A to 6C are cross-sectional views along VI-VI of FIG. 5. As shown in FIG. 6A, the bar type desiccants BD may include bar type desiccants 370a having a circular shape in their cross-sections. The bar type desiccant 370a have a height H1 equal to or less than a first gap G1 between the first and second substrates 310 and 360 in the concave portion and more than a second gap G2 between the first and second substrates 310 and 360 in the second region R2 except the desiccant packaging portion DP. In particular, the bar type desiccants 370a may be located parallel to one another in the desiccant packaging portion DP.

As shown in FIG. 6B, the bar type desiccants BD may include bar type desiccants 370b having a rectangular shape in their cross-sections. The bar type desiccant 370b have a height H2 equal to or less than the first gap G1 and more than the second gap G2. In particular, the bar type desiccants 370b may be located parallel to one another in the desiccant packaging portion DP.

Further, as shown in FIG. 6C, the bar type desiccants BD may include bar type desiccants 370c having a trapezoid shape in their cross-sections. The bar type desiccant 370c have a height H3 equal to or less than the first gap G1 and more than the second gap G2. In particular, the bar type desiccants 370c may be located parallel to one another in the desiccant packaging portion DP. Specifically, the bar type desiccants 370c may have a gradually increasing shape from a portion near to the first substrate 310 toward a portion near to the second substrate 330.

Accordingly, the bar type desiccant according to an embodiment of the present invention has a width equal to or smaller than a width of the concave portion, and a height equal to or smaller than a height of the desiccant packaging region DP and greater than the second gap.

Figure 7A:
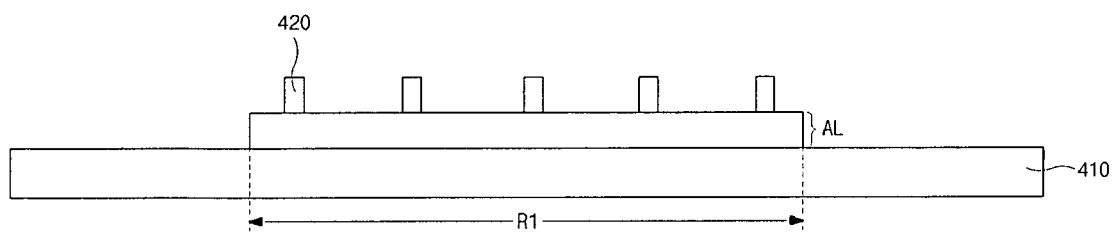
FIGS. 7A to 7F are schematic process views of a method of fabricating a dual panel type organic EL display device according to an embodiment of the present invention.

FIGS. 7A to 7F are schematic process views of a method of fabricating a dual panel type organic EL display device according to an embodiment of the present invention. As shown in FIG. 7A, an array element layer AL is formed on a first substrate 410, and a connection electrode 420 is formed on the array layer AL. Although not shown, the step of forming the array element layer AL includes forming a TFT connected to the connection electrode 420. The array element layer AL corresponds to an element that can provide a current to an emission element through the connection electrode 420 in a first region R1 of the organic EL display device.

Figure 7B:
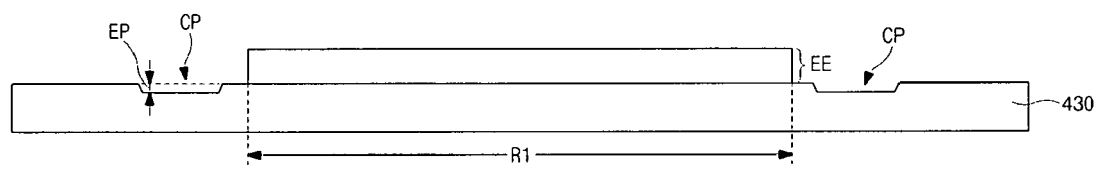

In FIG. 7B, a concave portion CP is formed in a periphery region of a second substrate 430, and an organic EL element layer EE is formed in the first region R1 of the second substrate 430. The concave portion CP may be formed by a wet-etching method using an etchant. The etchant may be one of hydrofluoric acid (HF) and nitric acid ($HNO_3$). In addition, an etching depth EP of the concave portion CP may be between about 200 mm and 300 mm, preferably be less than about 50 μm. Although not shown, the concave portion CP may be along three edges of the second substrate 430 similar to the desiccant packaging portion DP shown in FIG. 4A. Further, although not shown, the concave portion CP may be formed in the peripheral region of both the first and second substrates 410 and 430.

Figure 7C:
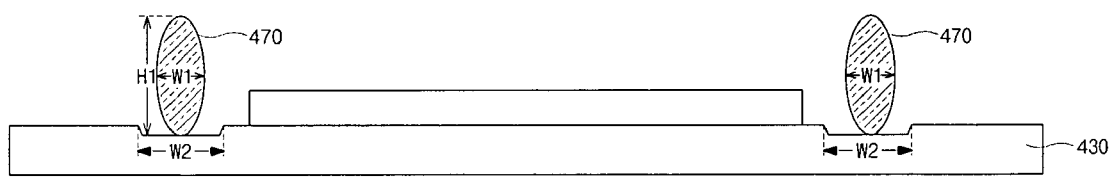

In FIG. 7C, a bar type desiccant 470 is disposed in the concave portion CP of the second substrate 430. For example, the bar type desiccant 470 is disposed on the second substrate 430, such that a major axis of the bar type desiccant 470 crosses a major axis of the second substrate 430. The bar type desiccant 470 may be formed using an oxide material having hygroscopicity, such as calcium oxide (CaO) and barium oxide (BaO).

The bar type desiccant 470 may include one or more bar type desiccants, and may have various cross-sectional shapes, such as square and trapezoid shapes. In addition, a first width W1 of the bar type desiccant 470 is equal to or less than a second width W2 of the concave portion CP. A first height H1 of the bar type desiccant 470 is between first and second gaps G1 and G2 between the first and second substrates 410 and 430. Further, the concave portion CP may be defined in the first substrate 410 instead of the second substrate 430. Alternatively, the concave portion CP may be defined in both the first and second substrates 410 and 430.

Figure 7D:
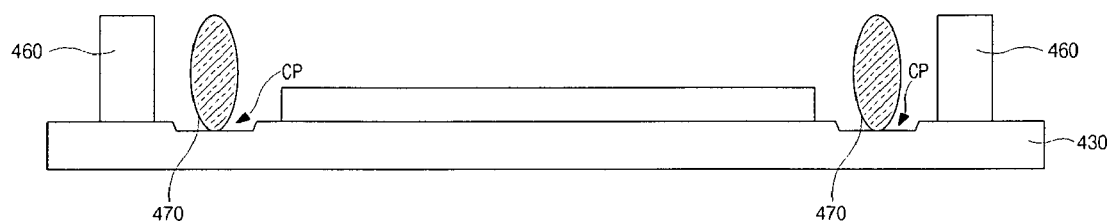

In FIG. 7D, a seal pattern 460 is formed in a periphery region of the second substrate 430 outside of the bar type desiccant 470.

Figure 7E:
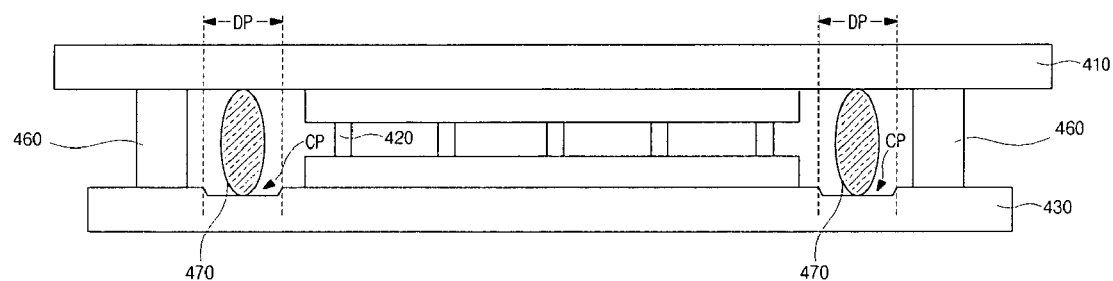

In FIG. 7E, to fix the bar type desiccant 470, the second substrate 430 is disposed at bottom, the first substrate 410 is disposed at top. Then, the first and second substrates 410 and 430 are attached to each other with the seal pattern 460. As a result, the connection electrode 420 and organic EL element layer EE are electrically connected, and the bar type desiccant 470 is fixed in the concave portion CP. The concave portion CP having the bar type desiccant 470 may be referred to as a desiccant packaging portion DP.

Figure 7F:
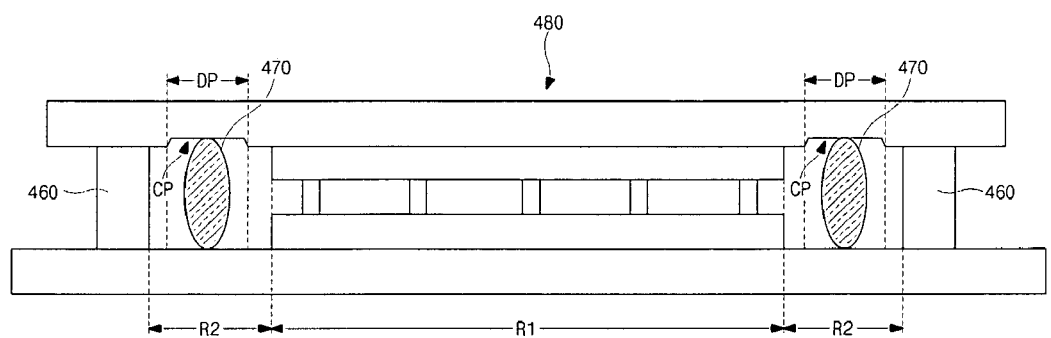

In FIG. 7F, a dual panel type organic EL display device 480 having a normal structure after the step of attaching is illustrated. Thus, a second region R2 including the desiccant packaging portion DP is between the first region R1 and the seal pattern 460 without an additional desiccant packaging portion. Therefore, space efficiency of the organic EL display device 480 is increased. Moreover, the bar type desiccant 470 in the concave portion CP is stably fixed by the concave portion CP in the desiccant packaging portion DP.

Accordingly, a dual panel type organic EL display device and a method of fabricating thereof according to an embodiment of the present invention have several advantages. First, because a dual panel type organic EL display device according to an embodiment of the present invention is a top emission type, a high aperture ratio is obtained. Second, because an array element layer including thin film transistors and an organic EL diode are independently formed on their respective substrates, disadvantages due to fabrication conditions of organic EL diodes are minimized, thereby improving the overall production yield.

Third, a bar type desiccant is disposed at a concave portion in a periphery region between an active region and a seal pattern region of the organic EL display device. Therefore, the organic EL display device according to an embodiment of the present invention obtains hygroscopicity without the need of an additional desiccant packaging portion. In addition, the dual panel type organic EL display device having the bar type desiccant and a method of fabricating the same according to an embodiment of the present invention have improved reliability, product life span, durability, and product stability.

It will be apparent to those skilled in the art that various modifications and variations can be made in the organic electroluminescent display device and the method of fabricating the same of the present invention without departing from the sprit or scope of the invention. Thus, it is intended that the present invention covers the modifications and variations of this invention provided they come within the scope of the appended claims and their equivalents.

What is claimed is:

1. An organic electroluminescent device, comprising:
   first and second substrates spaced apart from each other, the first and second substrates including a first region and a second region outside the first region;
   an array element on an inner surface of the first substrate, the array element including a switching element;
   an organic electroluminescent diode on an inner surface of the second substrate;
   a connection electrode electrically connecting the array element and the organic electroluminescent diode, the connection electrode between the first and second substrates; and
   a desiccant disposed between the first and second substrates, wherein the second region of the second substrate has a concave portion, and wherein the desiccant is disposed in the concave portion.

2. The device according to claim 1, further comprising a seal pattern attaching the first and second substrates, the second region being between the first region and the seal pattern.

3. The device according to claim 1, wherein a major axis of the desiccant crosses major axes of the first and second substrates.

4. The device according to claim 1, wherein the desiccant has a height equal to or less than a first gap between the first and second substrates in the concave portion.

5. The device according to claim 1, wherein the height of the desiccant is more than a second gap between the first and second substrates in the second region except the concave portion.

6. The device according to claim 1, wherein a first width of the desiccant is equal to or less than a second width of the concave portion.

7. The device according to claim 1, wherein the second region is along edges of the organic electroluminescent device.

8. The device according to claim 7, wherein the concave portion is continuous along the three edges of the organic electroluminescent device.

9. The device according to claim 1, wherein the array element includes a gate line along a first direction, a data line along a second direction crossing the gate line, and a power line crossing one of the gate line and the data line, and the switching element includes a switching thin film transistor and a driving thin film transistor, the switching thin film transistor connected to the gate and data lines, and the driving thin film transistor connected to the switching thin film transistor, the power line and the connection electrode.

10. The device according to claim 1, wherein the organic electroluminescent diode includes a first electrode, an organic electroluminescent layer, and a second electrode, the second electrode corresponding to a pixel region defined in the first region.

11. The device according to claim 1, wherein the desiccant includes a plurality of desiccant patterns spaced apart from each other in the concave portion.

12. The device according to claim 1, wherein the desiccant is formed of an oxide material.

13. The device according to claim 12, wherein the oxide material is selected from one of calcium oxide (CaO) and barium oxide (BaO).

14. The device according to claim 1, wherein the desiccant is formed as a bar type.

15. The device according to claim 1, wherein the organic electroluminescent diode includes two electrodes disposed only in the first region.

16. An organic electroluminescent device, comprising:
   a first substrate having first and second regions and having an array element layer formed thereon in the first region, the array element layer including a switching element;
   a second substrate facing the first substrate and having the first and second regions, the second substrate having an organic electroluminescent diode formed thereon in the first region, wherein at least one of the first and second substrates includes a concave portion in the second region;
   a connection electrode electrically connecting the switching element and the organic electroluminescent diode, the connection electrode between the first and second substrates; and
   a desiccant in the concave portion in the second region between the first and second substrates.

17. The device according to claim 16, further comprising a seal pattern attaching the first and second substrates, the second region being between the first region and the seal pattern.

18. The device according to claim 16, wherein the second region is along edges of the organic electroluminescent device.

19. The device according to claim 18, wherein the concave portion is continuous along three of the edges of the organic electroluminescent device.

20. The device according to claim 16, wherein the organic electroluminescent diode includes a first electrode, an organic electroluminescent layer, and a second electrode, the second electrode corresponds to a pixel region defined in the first region.

21. The device according to claim 16, wherein the desiccant includes a plurality of desiccant patterns spaced apart from each other in the concave portion.

22. The method according to claim 16, wherein the desiccant is formed of an oxide material.

23. The device according to claim 16, wherein the second substrate has the concave portion.

24. The device according to claim 16, wherein the organic electroluminescent diode includes two electrodes disposed only in the first region.

* * * * *